United States Patent
Pomp et al.

[19]

[11] Patent Number: 6,103,542
[45] Date of Patent: Aug. 15, 2000

[54] METHOD OF MANUFACTURING AN OPTOELECTRONIC SEMICONDUCTOR DEVICE COMPRISING A MESA

[75] Inventors: Hendrik G. Pomp; Bernardus A. H. Van Bakel, both of Eindhoven; Johanna M. Bokhorst, Nijmegen; Leo M. Weegels, Eindhoven, all of Netherlands

[73] Assignee: JDS Uniphase Corporation, San Jose, Calif.

[21] Appl. No.: 08/937,433

[22] Filed: Sep. 25, 1997

[30] Foreign Application Priority Data

Sep. 26, 1996 [EP] European Pat. Off. .............. 96202696

[51] Int. Cl.[7] .................................................. H01L 21/00
[52] U.S. Cl. ................................. 438/40; 438/41
[58] Field of Search .................... 438/39, 40, 41

[56] References Cited

U.S. PATENT DOCUMENTS

| | | | |
|---|---|---|---|
| 5,065,404 | 11/1991 | Okajima et al. | 372/46 |
| 5,416,044 | 5/1995 | Chino et al. | 437/129 |
| 5,658,823 | 8/1997 | Yang | 438/41 |
| 5,786,234 | 7/1998 | Nagai et al. | 438/47 |
| 5,956,361 | 9/1999 | Ikeda et al. | 372/46 |

FOREIGN PATENT DOCUMENTS

0477013A2  3/1992  European Pat. Off. .......... H01S 3/19

*Primary Examiner*—Brian Dutton

*Attorney, Agent, or Firm*—Michael A. Glenn

[57] ABSTRACT

An optoelectronic device, such as a laser of the ridge waveguide type, can be provided with the necessary mesa (14) by means of wet or dry etching with a mask (20). The etching process is stopped when an etching stopper layer (5) is reached. A laser obtained by wet etching is indeed least expensive, but it is found to have a kink in its power-current characteristic at an undesirably low power value.

According to the invention, such a laser must be manufactured in that the mask (20) used is given a width which is (much) greater than the width desired for the mesa (14), and in that, after a (preferably wet) etching process down to or down to close to the etching stopper layer (5), etching is continued with a wet isotropic etchant which is selective relative to the etching stopper layer (5) until the mesa (14) formed has the desired width.

A very narrow and steep mesa (14) can thus be realized in an inexpensive manner. It is found that a laser with such a mesa (14) does not exhibit the kink mentioned above until at a comparatively high power. When used in the GaAs/AlGaAs material system, the invention results in a laser which is highly suitable for use as a writing laser in a system for optical registration, or as a pumping laser in a system for glass fiber communication. The two etching steps mentioned may be carried out with one and the same wet etchant, for example an etchant based on $C_6H_8O_7$ (citric acid) in the case of the GaAs/AlGaAs material system. It is alternatively possible, for example, to use two etchants, for example the etchant based on citric acid mentioned above and a second etchant based on $Na_2Cr_2O_7$.

9 Claims, 3 Drawing Sheets

METHOD OF MANUFACTURING AN OPTOELECTRONIC SEMICONDUCTOR DEVICE COMPRISING A MESA

BACKGROUND OF THE INVENTION

1. Field of the Invention

The invention relates to a method of manufacturing an optoelectronic device comprising a mesa, preferably a semiconductor diode laser often referred to as laser hereinafter for short, whereby a semiconductor body is formed through the provision on a substrate of at least in that order: a first cladding layer, preferably of a first conductivity type, an active layer, a second cladding layer preferably of a second conductivity type opposed to the first, and preferably a contact layer of the second conductivity type, and whereby a preferably strip-shaped mesa is formed at the surface of the semiconductor body so as to comprise at least a major portion of the second cladding layer, through the provision of a mask on the surface of the semiconductor body, and through the subsequent removal from the semiconductor body of semiconductor material situated outside the mask through etching down to or down to close to an etching stopper layer which forms part of the semiconductor body.

Such a method is particularly suitable for the manufacture of lasers of the—possibly buried—heterojunction or ridge waveguide type. LEDs (=Light Emitting Diodes) or waveguides may also be manufactured in this manner. In the present Application, accordingly, the term "active layer" is understood also to cover a radiation guiding layer. A laser of the (buried) ridge waveguide type which emits at or below 1 $\mu$m is particularly suitable for use in an optical disc system such as a system for optical registration, and for use as a pumping laser in a glass fiber communication system.

2. Description of the Related Art

Such a method of manufacturing a laser of the buried ridge waveguide type is known from a European Patent document published Mar. 25, 1992 under no. 0.477.013. The semiconductor body of the laser (see FIG. 1) is manufactured (see FIG. 2) in that the following are provided in that order on a GaAs substrate: a first cladding layer of AlGaInP, an active layer of GaInP, a second cladding layer of AlGaInP, and a GaAs contact layer. The second cladding layer is subdivided into a thin and a thick portion between which an etching stopper layer is provided. A strip-shaped mesa is formed in that a mask is provided and subsequently the semiconductor material outside the mask is removed down to the etching stopper layer by means of preferential etching with an etchant based on $H_2SO_4$. The mesa is given a trapezium-shaped cross-section in that manner.

A disadvantage of the known method is that the laser manufactured thereby shows a kink in the relation between the emitted optical power and the current through the laser at comparatively low powers. Owing to this kink, the characteristic is not linear, which restricts the usefulness of the laser, for example in a system for optical registration.

SUMMARY OF THE INVENTION

The present invention has for its object inter alia to provide an inexpensive method by which lasers comprising mesas can be formed with a high kink power, i.e. lasers whose power-current characteristic remains linear down to a high power value.

According to the invention, a method of the kind described in the opening paragraph is for this purpose characterized in that the mask is given a width which is greater than the width desired for the mesa to be formed, and etching of the semiconductor body is continued with an isotropic wet-chemical etchant which is selective relative to the etching stopper layer after etching down to or down to close to the etching stopper layer until the mesa formed has the desired width. It was experimentally found that the kink mentioned above occurs at a higher power value in proportion as the mesa is less wide and in proportion as it has straighter side walls. The trapezium-shaped cross-section of the mesa obtained in the known method implies that photolithography for a narrower mesa becomes increasingly difficult, and that the side walls of the mesa will be oblique. A solution to this problem is the use of the RIE (=Reactive Ion Etching) technique, with which very narrow and steep mesas can be manufactured. This technique, however, is comparatively expensive compared with a (wet) chemical technique.

The use of a mask according to the invention which is (much) wider than the desired mesa width renders it possible to continue etching for a longer time after a wetchemical etching process has taken place down to or down to close to the etching stopper layer. Thanks to the presence of the etching stopper layer on the one hand and to the use of an etchant which etches the second cladding layer isotropically and is selective relative to the etching stopper layer on the other hand, the mesa becomes ever narrower, but not higher, and in addition ever steeper at the area of the second cladding layer during further etching from the moment the etching stopper layer is reached. A laser obtained by a method according to the invention thus has a higher kink power than a laser obtained by the known method. The method according to the invention is simple and inexpensive owing to the use of a wet-chemical etchant which does not require a special etching equipment. Such an etchant may also be used for etching down to or down to close to the etching stopper layer. Both etching steps may advantageously be carried out with one and the same wet-chemical etchant.

The laser manufactured by a method according to the invention has a particularly high kink power when the mesa is given a width which lies between 1.5 and 2.5 $\mu$m. A suitable height for the mesa in that case is one to a few micrometers. A favorable ratio of the width of the mask to the desired width of the mesa to be formed is greater than or equal to 1.5 then. Very good results are obtained when said ratio is greater than or equal to 2, while the flanks of the mesa hardly increase in steepness any more when a value greater than or equal to 5 is chosen. The method also becomes increasingly expensive in the case of a longer etching treatment. An optimum ratio found in practice is approximately 3.

In a preferred embodiment of a method according to the invention, whereby the etching stopper layer within the second cladding layer is provided close to the active layer and a contact layer is provided on the second cladding layer, a material is chosen for the etching stopper layer other than the material for the contact layer, and etching of the semiconductor body down to or down to close to the etching stopper layer and the continuation of the etching treatment are carried out with one and the same wet-chemical etchant. The method is further simplified by the use of a single wet-chemical etchant. Lasers of the ridge type manufactured in this manner in the GaAs/AlGaAs material system emit at approximately 0.8 $\mu$m to approximately 1.0 $\mu$m and are highly suitable as (reading and) writing lasers in a system for optical registration, or as pumping lasers in a system for optical communication. A mixture of $C_6H_8O_7$, $H_2O_2$, and H$_2$O forms a particularly suitable etchant for this system. This etchant etches a GaAs contact layer kinetically and an AlGaAs cladding layer isotropically. In such a case the etching stopper layer should comprise a material different from the contact layer material. GaInP was found to be a very suitable material for this. This embodiment forms a particularly suitable material for a laser which emits around 0.8 μm, where the active layer comprises, for example, AlGaAs, because the absorption in a GaInP etching stopper layer is small in that case. An important advantage of this embodiment is that the mesa has approximately the same width at the area of the contact layer and at the area of the second cladding layer. The risk that a metal layer provided over the mesa will have interruptions is rendered small thereby. Consequently, the connection conductor which is connected to the metal layer at some distance from the mesa will make a good and symmetrical electrical contact with the contact layer.

In another, also favorable embodiment of a method according to the invention, whereby the etching stopper layer is provided within the second cladding layer and close to the active layer and a contact layer is provided on the second cladding layer, the same semiconductor material is chosen for the etching stopper layer and for the contact layer, a single wet-chemical etchant is used for etching down to or down to close to the etching stopper layer, and a different wet-chemical etchant, which is selective relative to both the etching stopper layer and the contact layer, is used for continuing the etching treatment. The etchant mentioned above on the basis of C$_3$H$_8$O$_7$ (citric acid) is used as the first etchant, for example. A mixture of Na$_2$Cr$_2$O$_7$, H$_3$PO$_4$, and H$_2$O is preferably used for the continuation of the etching treatment. This etches the AlGaAs cladding layer selectively relative to GaAs, of which in this embodiment both the contact layer and the etching stopper layer were made. This modification is particularly suitable for a pumping laser which emits at 1 μm and which is obtained through the choice of an InGaAs active layer, because a GaAs etching stopper layer absorbs substantially no radiation in that case. The laser is given a mesa thereby which is wider at the area of the contact layer than at the area of the second cladding layer. This has the advantage that the contact resistance of the laser is particularly low.

An active region formed in the active layer below the mesa is preferably provided with a lateral step in the effective refractive index which lies between $2*10^{-3}$ and $7*10^{-3}$ in the manufacture of lasers as mentioned above with mesas whose width lies between 1.5 and 2.5 μm, while both the width of the mesa and said step in the refractive index are chosen such that interference between the zero order and the first order lateral modes during operation of the laser in the active region is just avoided. The desired step in the refractive index is realized through a suitable choice of the thickness and materials, or material compositions, of the active layer and of the (portions) of the second cladding layer in a manner which is known per se to those skilled in the art. Such a step in the refractive index and such a width of the mesa lead to a suppression of the first order lateral mode so that an interference between the zero order and first order lateral modes, which leads to a kink in the power-current characteristic, does not occur. A choice of the width and the step in the refractive index such that the first order lateral mode is not very strongly suppressed gives the laser thus manufactured a radiation beam with a far field pattern whose apex angle has a comparatively high value of 9 to 15 degrees parallel to the active layer. When the width of the mesa and the step in the refractive index are chosen such that the first order lateral mode is strongly suppressed—which would seem to be obvious with a view to a high kink power—, said apex angle is found to be no more than 6 to 7 degrees. Given the fact that the apex angle of the radiation beam perpendicular to the active layer is approximately 20 degrees in practice, this means that a laser manufactured in accordance with this modification has a radiation beam of substantially optimum symmetry. This is an important advantage in the applications mentioned above.

Preferably, one or several further semiconductor layers or an insulating layer is/are provided on either side of the mesa formed. An insulating layer may be readily provided, for example, through anodic oxidation of the semiconductor material outside the (strip-shaped) mask on the mesa formed. After removal of the mask, a metal layer can be deposited over the entire semiconductor surface, making electrical contact at the area of the contact layer only. After the lower side of the semiconductor body has also been metallized, lasers suitable for final mounting will be obtained after two cleaving operations transverse to the longitudinal direction of the strip-shaped mesa.

BRIEF DESCRIPTION OF THE INVENTION

The invention will now be explained in more detail with reference to two embodiments and the accompanying drawing, in which FIGS. 1 to 9 show an embodiment of a method according to the invention for the manufacture of a ridge waveguide laser in cross-sectional views perpendicular to the longitudinal direction of the laser and in consecutive stages of manufacture.

The Figures are diagrammatic and not true to scale, the dimensions in the thickness direction being particularly exaggerated for greater clarity. Corresponding components have been given the same reference numerals as a rule in the various Figures. Semiconductor regions of the same conductivity type have been hatched in the same direction as a rule.

DETAILED DESCRIPTION OF THE INVENTION

Figure 1:
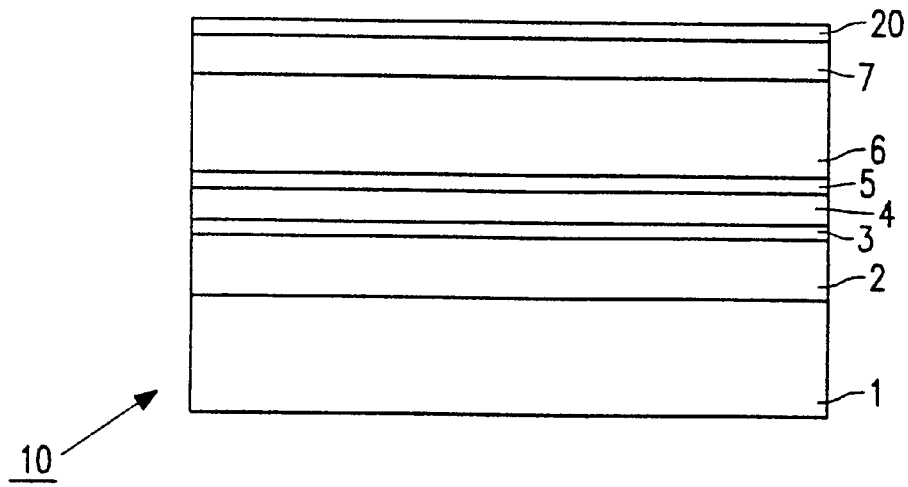
Figure 2:
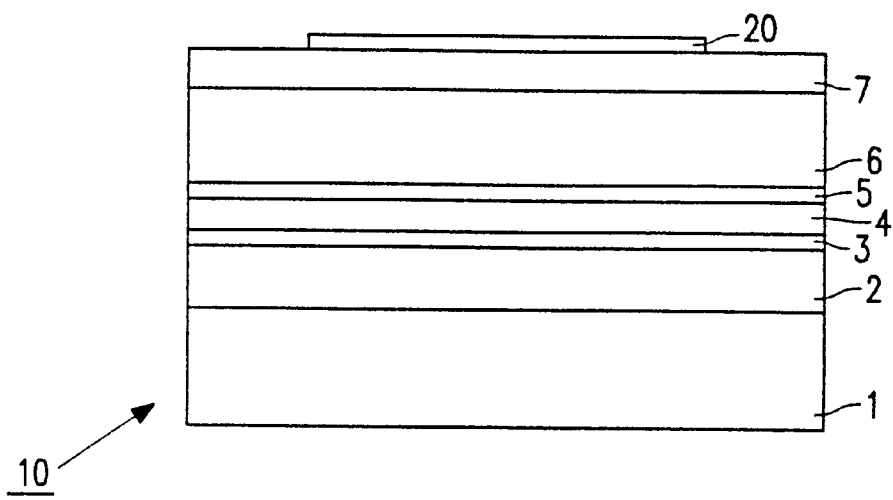
Figure 3:
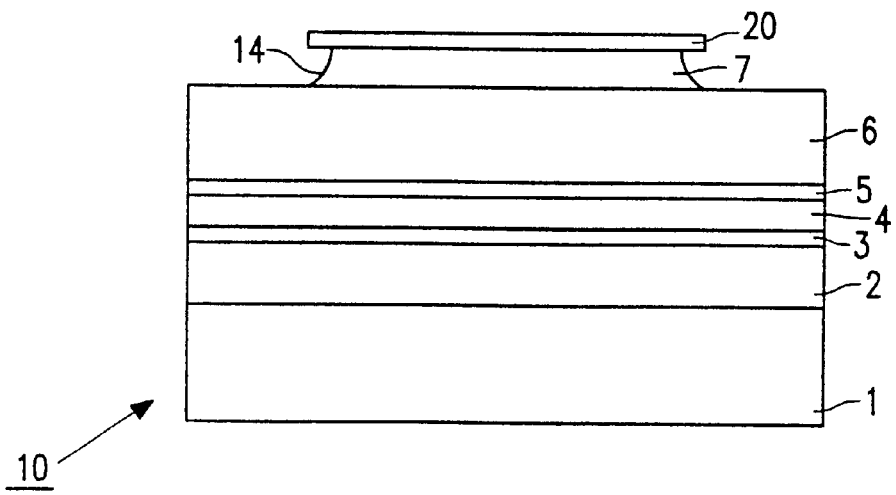
Figure 4:
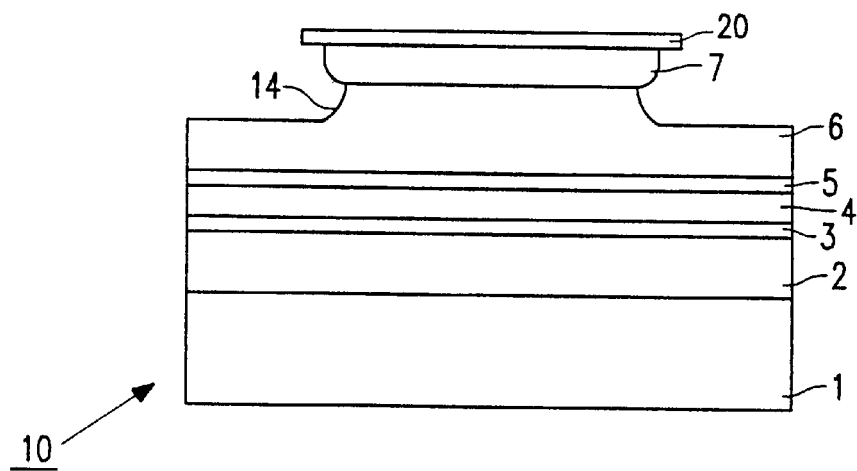
Figure 5:
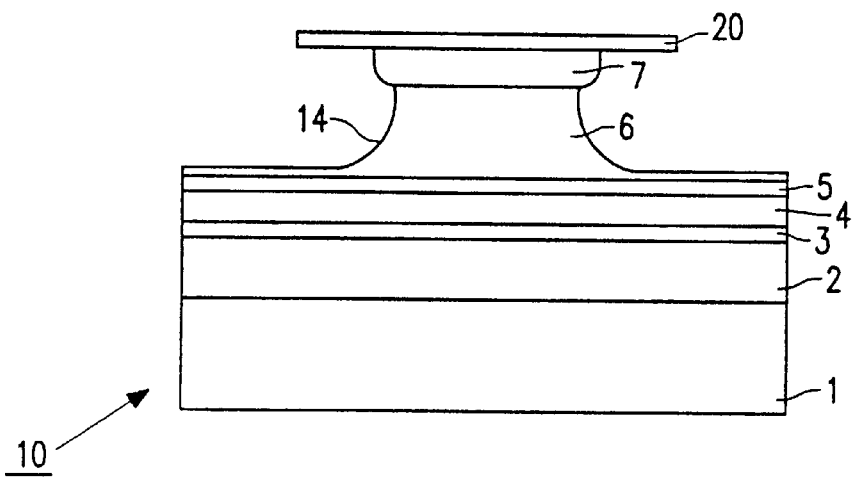
Figure 6:
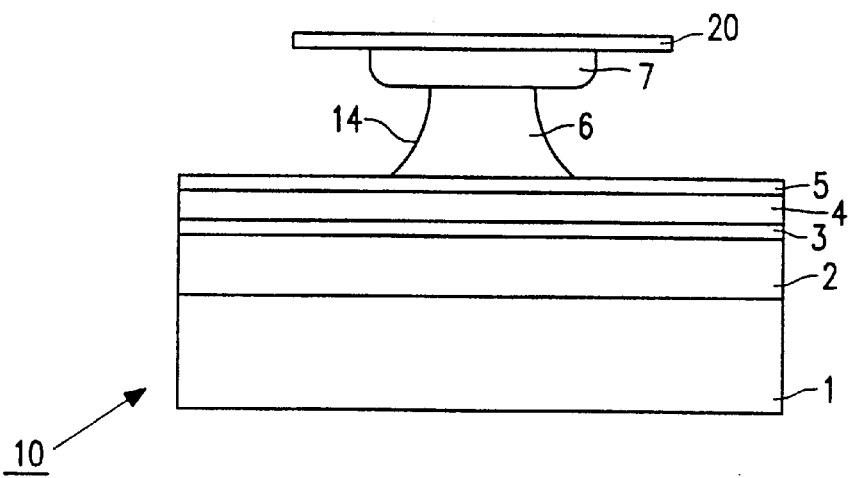
Figure 7:
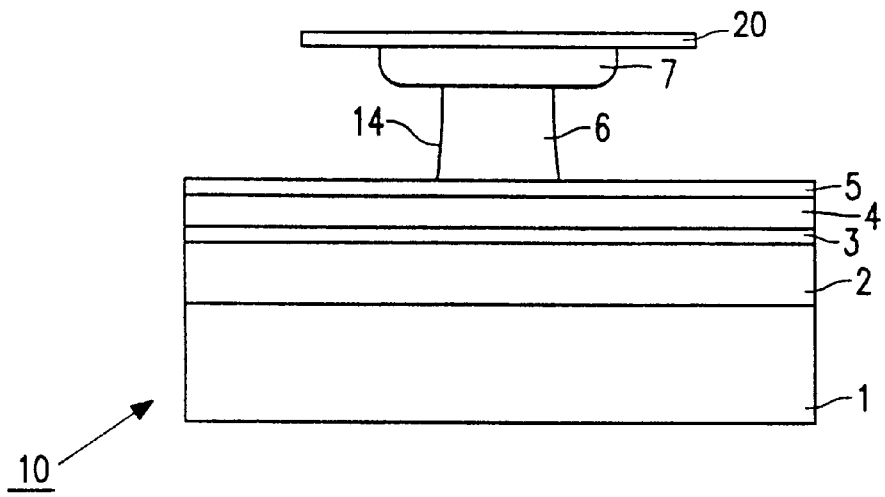
Figure 8:
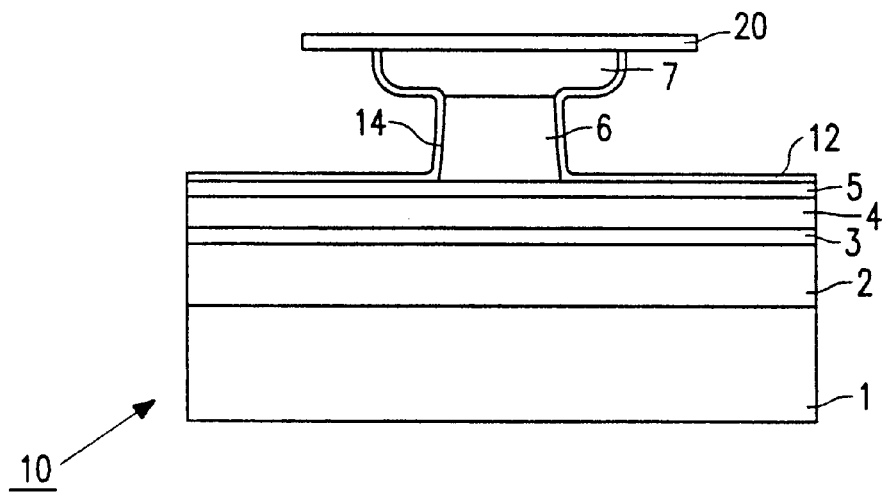
Figure 9:
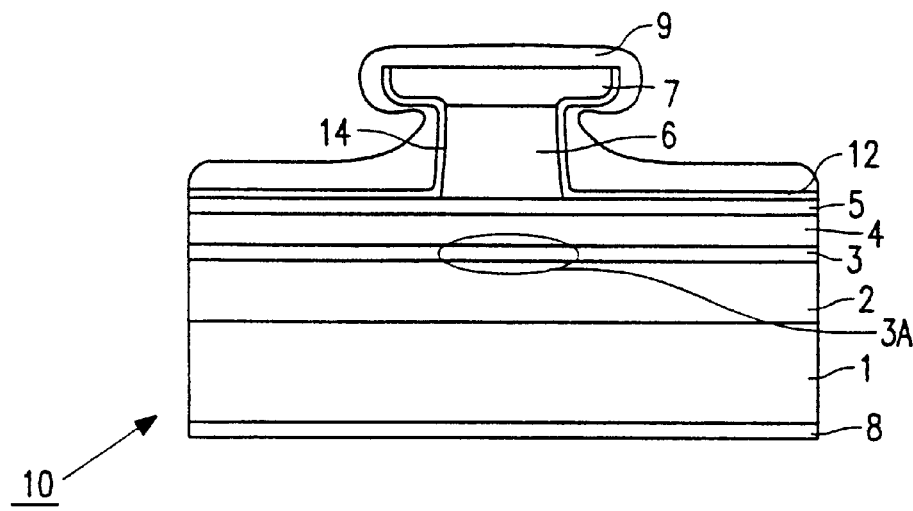

FIGS. 1 to 9 show an embodiment of a method according to the invention for the manufacture of a ridge waveguide laser in cross-sectional views perpendicular to the longitudinal direction of the laser and in consecutive stages of manufacture. The formation of a semiconductor body 10 starts (see FIG. 1) with a substrate 1 of monocrystalline n-type GaAs with a doping concentration of 2 to $5*10^8$ at/cm$^3$, with a thickness of approximately 350 μm and a (001) orientation. The following are grown thereon in that order by means of MOVPE (=Metal Organic Vapor Phase Epitaxy): a 2 μm thick first cladding layer 2 of n-type AlGaAs with an Al content of 50% and a doping concentration of $1*10^{18}$ at/cm$^3$, an approximately 0.04 μm thick active layer 3 of not intentionally doped AlGaAs with an Al content of 13%, which corresponds to an emission wavelength of approximately 785 nm, a 0.5 μm thick first portion 4 of a second cladding layer 4, 6 of p-type AlGaAs with approximately the same Al content and the same doping concentration as the first cladding layer 2, a 0.02 μm thick etching stopper layer 5 of p-type GaAs with approximately the same doping concentration as the second cladding layer 4, 6, a 1.2 μm thick second portion 6 of the second cladding layer 4, 6, again of p-type AlGaAs and with approximately the same Al content and the same doping concentration as the first portion 4, and—in this example—a 0.4 μm thick contact layer 7 of p-type GaAs with a doping concentration of $1*10^{19}$ at/cm$^3$.

After removal of the assembly from the growing apparatus, a mask 20 of silicon dioxide, strip-shaped in this case and 0.1 μm thick, is provided on the assembly (see FIG. 2) by means of plasma deposition and photolithography. Subsequently (see FIGS. 3, 4 and 5), a mesa 14, strip-shaped in this case, is formed at the surface of the semiconductor body 10 so as to comprise at least a major portion 6 of the second cladding layer 4, 6, in this case the portion 6 situated above the etching stopper layer 5 and also comprising the contact layer 7 here, in that semiconductor material 6, 7 situated outside the mask 20 is removed from the semiconductor body 10 through etching down to or down to close to, in this case down to close to the etching stopper layer 5.

According to the invention, the width of the mask 20 is chosen to be (much) greater than the width desired for the mesa 14 to be formed, and etching of the semiconductor body 10 is continued after etching down to or down to close to the etching stopper layer 5 (see FIGS. 6 and 7) with an isotropic wet-chemical etchant which is selective relative to the etching stopper layer 5 until the mesa 14 formed has the desired width. The use of a wet-chemical etchant renders the method according to the invention inexpensive. Thanks to the presence of the etching stopper layer 5 and thanks to the use of an isotropic etchant, which underetches with respect to the mask 20 with a more or less circular profile, the mesa 14 thus obtained is not only particularly narrow but also particularly steep. A very narrow, for example 2 μm wide as in the present example, and steep mesa 14 is found to give the laser a particularly high so-called kink power. This means that the relation between the optical power and the current in such a laser is a linear one down to said high kink power, in the present example 80 to 100 mW. The composition and thicknesses of the relevant layers 3, 4 used here imply that the lateral step in the effective refractive index is approximately $2*10^{-3}$. The first order lateral mode is just suppressed then in a mesa of 2 μm width. This has the result that the far field parallel to the active layer 3 of a laser thus manufactured has a comparatively great apex angle, in this example an apex angle of 10 degrees. This renders the radiation pattern comparatively symmetrical, which is an important advantage.

The isotropic etchant used here for the second cladding layer 4, 6 comprises a mixture of $Na_2Cr_2O_7$, $H_3PO_4$, and $H_2O$, in this example 3.6 g $Na_2Cr_2O_7.2H_2O$, 100 ml $H_3PO_4$ and 100 ml $H_2O$. This mixture etches AlGaAs selectively relative to GaAs. Since the contact layer 7 is not attacked (any further) in this etching step, the mesa 14 will be wider at the area of the contact layer 7 than at the area of the second cladding layer 6, i.e. 4 μm and 2 μm wide, respectively. The height of the mesa 14 here is 1.6 μm (=1.2 μm+0.4 μm). The strip-shaped mask 20 in this example has a width of 6 μm. This means that the ratio of the width of the mask 20 to the mesa 14 at the area of the second cladding layer 4, 6 is approximately 3. The value of this ratio depends inter alia on the desired width, height, and steepness of the mesa 14 to be formed. Favorable results have been obtained in practice with a ratio of 1.5. The best results have been obtained with a ratio which is greater than 2 and smaller than 5. Above the latter value, the mesa 14 hardly increases in steepness, while the increasing etching time renders the manufacture more expensive. In this example, the etching time with the isotropic etchant is approximately 10 minutes. Etching takes place at 40 degrees and while stirring.

Preferably, a wet-chemical etchant is also used for the etching treatment down to or down to close to the etching stopper layer 5 for reasons of economy. The etchant with which etching down to close to the etching stopper layer 5 takes place in the present example comprises a mixture of $C_6H_8O_7$, $H_2O_2$, and $H_2O$, here 150 g $C_3H_8O_7.H_2O$, 3 ml $H_2O_2$ and 150 ml $H_2O$. This etchant etches AlGaAs isotropically and GaAs preferentially. Since the etching stopper layer 5 comprises GaAs, etching with this etchant is stopped the moment the etching stopper layer 5 is approached, here to a distance of 0.2 μm. The required etching time is estimated in that the etching rate is divided by the thickness to be etched, being approximately 60 minutes in this example. The etching depth is measured at intervals for increasing the accuracy. The width of the mesa 14 after this etching step is approximately 4 μm. Then the etching step described above is carried out with the etchant based on $Na_2Cr_2O_7$, whereby the mesa 14 becomes even narrower and steeper exclusively at the area of the second cladding layer 6. The contact resistance of the laser is particularly low owing to the comparatively great width at the area of the contact layer 7.

After the two etching steps, the semiconductor body 10 (see FIG. 8) is placed in a bath containing 0.02 mole $NH_4H_2PO_4$, 100 ml $C_2H_6O_2$ (ethylene glycol), and 50 ml $H_2O$, and the surface of the semiconductor body 10 is oxidized anodically. An electrically insulating layer 12 is formed thereby next to and against the mesa 14. After removal of the mask 20 and metallization on two sides, the semiconductor body is cleaved and broken up, so that individual lasers ready for final mounting are obtained (see FIG. 9).

In a favorable modification of the embodiment described here, the two etching steps are carried out with one and the same wet-chemical isotropic etchant. A suitable etchant in that case is the etchant described above based on $C_6H_8O_7$ (citric acid). The required etching time in that case is approximately 110 minutes. An important asvantage of this modification is that it is cheaper. In this modification, different materials are chosen for the etching stopper layer 5 and for the contact layer 7, i.e. GaInP and GaAs, respectively. An etching stopper layer 5 of GaInP is found to be surprisingly effective with an etchant based on $C_6H_8O_7$ (citric acid). Such an etching stopper layer 5 of GaInP may also be used to advantage in the embodiment described further above. A further difference with the embodiment described with reference to the Figure is the width of the mesa 14 at the area of the contact layer 7. This width is now substantially equal to the width of the mesa 14 at the area of the portion 6 of the second cladding layer 4, 6, i.e. also 2 μm. This has the advantage that the risk of interruptions of the metal layer 9 on the lateral side of the mesa 14 (see FIG. 9) is smaller than in the embodiment described earlier. As a result, the connection between a connection conductor (not shown in the drawing) and the contact layer 7 is still satisfactory and symmetrical if the connection conductor is provided farther away from the mesa 14 on the metal layer 9.

The invention is not limited to the embodiment and modification thereof described, since many modifications and variations are possible to those skilled in the art within the scope of the invention. Thus semiconductor materials or compositions other than those mentioned may be used. Lasers, LEDs, or radiation waveguides may also be manufactured in the GaInP/AlGaInP or GaInAsP/InP material systems. Lasers will also emit in the red or infrared part, respectively, of the spectrum in these cases.

The invention may be applied not only to lasers and other optoelectronic devices of the—possibly buried—ridge type but also to lasers whose mesas comprise a larger portion of the layer structure than merely (part of) the second cladding layer and a contact layer, if applicable. The mesa in that case may also comprise the active layer and (part of) the first cladding layer, or even part of the substrate. In such a case, an etching stopper layer will be present on, in, or below the first cladding layer, or even in the substrate.

What is claimed is:

1. A method of manufacturing an optoelectronic device comprising a mesa, whereby a semiconductor body is formed through the provision on a substrate of a first cladding layer, an active layer, a second cladding layer, and whereby a mesa is formed at the surface of the semiconductor body so as to comprise at least a major portion of the second cladding layer, through the provision of a mask on the surface of the semiconductor body and through the subsequent removal from the semiconductor body of the semiconductor material situated outside the mask through etching down to an etching stopper layer which forms part of the semiconductor body, characterized in that the mask is given a width which is greater than the width of the mesa to be formed, and after etching down to the etching stopping layer, etching of the semiconductor body is continued with an isotropic wet chemical etchant which is selective relative to the etching stopper layer until the mesa formed has a width, wherein the ratio of the width of the mask to the width of the mesa is at least 1.5.

2. A method as claimed in claim 1, characterized in that the ratio of the width of the mask to the width of the mesa is at least 2.0.

3. A method as claimed in claim 1, characterized in that the ratio of the width of the mask to the width of the mesa is at most 5.

4. A method as claimed in claim 1, whereby the etching stopper layer within the second cladding layer is provided proximate to but spaced from the active layer, and a contact layer is provided on the second cladding layer, characterized in that a material is chosen for the etching stopper layer other than the material for the contact layer, and etching of the semiconductor body down to the etching stopper layer and the continuation of the etching treatment are carried out with one and the same etchant.

5. A method as claimed in claim 1, whereby the etching stopper layer is provided within the second cladding layer proximate to but spaced from the active layer and a contact layer is provided on the second cladding layer, characterized in that the etching stopper layer and the contact layer are comprised of a same semiconductor material, a single etchant is used for etching the semiconductor body down to the etching stopper layer, and a different etchant, which is selective relative to both the etching stopper layer and the contact layer, is used for continuation of the etching treatment.

6. A method as claimed in claim 4 or 5, characterized in that the semiconductor material chosen for the contact layer is GaAs, the semiconductor material chosen for the second cladding layer is AlGaAs, the semiconductor material chosen for etching stopper layer is GaAs or InGaP, and the etchant for etching the semiconductor body down to the etching stopper layer is chosen to be a mixture of $C_6H_8O_7$ (citric acid), $H_2O_2$ and $H_2O$, and for continuing the etching treatment the same mixture of $C_6H_8O_7$ (citric acid), $H_2O_2$ and $H_2O$, or a mixture of $Na_2Cr_2O_7$, $H_3PO_4$, and $H_2O$.

7. A method as claimed in claim 1, characterized in that the first cladding layer is of a first conductivity type, the second cladding layer is of a second conductivity type opposed to the first, the mesa and the mask are strip-shaped and the optoelectronic semiconductor device is formed as a semiconductor diode laser, preferably in the GaAs/AlGaAs material system, the material chosen for the active layer being AlGaAs or GaInAs.

8. A method as claimed in claim 7, characterized in that the mesa is given width of between 1.5 and 2.5 $\mu$m at least at the area of the second cladding layer, and an active region formed in the active layer at the are of the mesa is given a lateral step in the effective refraction index which lies between $2*10^{-3}$ and $7*10^{-3}$, and in that the width of the mesa and the lateral step in the effective refractive index are chosen such that interference between the zero order and the first order lateral modes is avoided in the active region during operation.

9. A method as claimed in claim 8, characterized in that one or several further semiconductor layers or an insulating layer is/are provided on either side of the mesa formed, the semiconductor body is provided with conductive layers, on either side after the mask has been removed, and individual semiconductor diode lasers are obtained by twice transversely to the longitudinal direction of the strip-shaped mesa.

* * * * *